(12) United States Patent
Sakurada et al.

(10) Patent No.: US 7,129,123 B2
(45) Date of Patent: Oct. 31, 2006

(54) SOI WAFER AND A METHOD FOR PRODUCING AN SOI WAFER

(75) Inventors: Masahiro Sakurada, Fukushima (JP); Nobuaki Mitamura, Fukushima (JP); Izumi Fusegawa, Fukushima (JP); Tomohiko Ohta, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 14 days.

(21) Appl. No.: 10/500,580

(22) PCT Filed: Oct. 24, 2003

(86) PCT No.: PCT/JP03/13645

§ 371 (c)(1),
(2), (4) Date: Jul. 1, 2004

(87) PCT Pub. No.: WO2004/040650

PCT Pub. Date: May 13, 2004

(65) Prior Publication Data

US 2005/0064632 A1    Mar. 24, 2005

Related U.S. Application Data

(63) Continuation of application No. 10/204,935, filed on Aug. 27, 2002, now Pat. No. 6,913,646.

(30) Foreign Application Priority Data

Oct. 31, 2002    (JP)    ............................. 2002-317634

(51) Int. Cl.
*H01L 21/84* (2006.01)
*H01L 31/36* (2006.01)
*C30B 15/20* (2006.01)

(52) U.S. Cl. .......................... 438/166; 257/51; 117/13

(58) Field of Classification Search ............ 117/13–15, 117/20, 932; 438/149, 166, 455–459; 257/49–52, 257/63–65, 73–75
See application file for complete search history.

(56) References Cited

U.S. PATENT DOCUMENTS

| | | | |
|---|---|---|---|
| 6,482,260 B1* | 11/2002 | Sakurada et al. | .............. 117/20 |
| 6,913,646 B1* | 7/2005 | Sakurada et al. | .............. 117/13 |
| 2003/0106484 A1* | 6/2003 | Fusegawa et al. | ............ 117/19 |

(Continued)

FOREIGN PATENT DOCUMENTS

JP    A 10-79498    3/1998

(Continued)

*Primary Examiner*—Calvin Lee
(74) *Attorney, Agent, or Firm*—Oliff & Berridge, PLC

(57) ABSTRACT

In a method for producing an SOI wafer comprising steps of implanting ions from a bond wafer surface to form an ion-implanted layer inside the wafer, bonding the ion-implanted bond wafer surface and a surface of a base wafer via an oxide film or directly, and forming an SOI wafer by delaminating by heat treatment a part of the bond wafer at the ion-implanted layer, the bond wafer is a silicon wafer that consists of a silicon single crystal grown by Czochralski method, that is occupied by N region outside OSF generated in a ring shape and that has no defect region detected by Cu deposition method. Thereby, even an extremely thin SOI layer having a thickness of 200 nm or less, can provide an SOI wafer that has an excellent electric property without micro pits caused by acid cleaning, and can be produced without increasing the number of processes.

13 Claims, 9 Drawing Sheets

U.S. PATENT DOCUMENTS

2005/0032331 A1* 2/2005 Nakano .................. 438/459
2005/0211158 A1* 9/2005 Hoshi et al. .............. 117/19

FOREIGN PATENT DOCUMENTS

| JP | A 2001-44398 | 2/2001 |
| JP | A 2001-146498 | 5/2001 |
| JP | A 2002-201093 | 7/2002 |
| JP | A 2002-226296 | 8/2002 |

* cited by examiner

SOI WAFER AND A METHOD FOR PRODUCING AN SOI WAFER

This application is a 371 OF PCT/JP03/13645 filed on Oct. 24, 2003, and is a continuation of U.S. application Ser. No. 10/204,935 Filed on Aug. 27, 2002 now U.S. Pat. No. 6,913,646.

TECHNICAL FIELD

The present invention relates to an SOI wafer, more particularly, to an SOI wafer having extremely high electrical reliability even in the case that a thin silicon active layer is formed, and to a method for producing such an SOI wafer.

BACKGROUND ART

Conventionally, as a substrate for a device, an SOI wafer wherein a silicon active layer (an SOI layer) is formed on a support substrate has been widely utilized. As a method for producing such an SOI wafer, for example, it is known that a bonding method in which two silicon wafers are bonded together via an oxide film. In ion implantation delamination method which is one of bonding methods, an oxide film (an insulator layer) is formed on a surface of a silicon wafer (a bond wafer) to be a silicon active layer or a base wafer to be a support substrate, and an ion-implanted layer is formed inside the bond wafer by implanting ions such as hydrogen from one side surface of the bond wafer. Further, after this bond wafer is bonded to the base wafer via the oxide film, delamination is performed at the ion-implanted layer by heat treatment. Thereby, an SOI wafer in which a thin silicon active layer is formed on the base wafer via the oxide film can be obtained.

Further, there are also some cases that an insulator support substrate is used and a bond wafer is bonded to this directly, i.e., without an oxide film.

In the case of producing an SOI wafer as described above, a silicon wafer on the surface of which micro pit defects with 50 nm or more in size exist has been generally used as a bond wafer. However, in recent years, the demand for thinning the silicon active layer increases, and the demand for quality of a silicon wafer applicable to this has also become strict.

In order to reduce defects in the silicon active layer, there has been proposed the use of an epitaxial layer or a silicon single crystal in so-called a neutral region (N region) where there exist no defects caused during growth of the single crystal which is called grown-in defects such as FPD, LSTD and COP.

For example, there has been proposed a method for producing an SOI wafer by forming an epitaxial layer on a silicon wafer (a bond wafer), implanting boron ions into the epitaxial layer, subsequently bonding the wafer to a support substrate via an oxide film, and further grinding and polishing the back surface of the bond wafer (for example, see Japanese Patent Laid-open (Kokai) No. 10-79498 (on pages 4–6, in FIG. 2)).

However, in the case of using the wafer on which the epitaxial layer is formed as the bond wafer as described above, defects in the SOI layer can be improved, but there has been a problem that the production cost remarkably increases because the process for growing the epitaxial layer increases.

On the other hand, as a bond wafer, in the case of using a silicon wafer grown in N region where no micro defect such as FPD and COP exists, although it is required to accurately control growth conditions of a silicon single crystal, there is an advantage that process for forming the epitaxial layer is not needed.

N region will be explained herein. It is known that in the case of changing a growth rate V from high speed to low speed in the direction of a crystal growth axis in a CZ pulling apparatus with a usual furnace structure (hot zone: HZ) having a large temperature gradient G at the vicinity of a solid-liquid interface in a crystal, a defect distribution diagram as shown in FIG. 9 can be obtained.

In FIG. 9, V region is a region that contains a large amount of vacancies, i.e., depressions, pits, or the like caused by lack of silicon atoms, and I region is a region that contains a large amount of dislocations or clusters of excess silicon atoms caused by existence of excess silicon atoms. It has also been confirmed that there exists a neutral (hereinafter occasionally abbreviated as N) region that contains no (or little) lack or excess of the atom between V region and I region, and defects called OSF (Oxidation Induced Stacking Fault) are distributed in a ring shape (hereinafter occasionally referred to as OSF ring) near a boundary of V region when observed in the cross section perpendicular to a crystal growth axis.

When the growth rate is relatively high, there exist grown-in defects such as FPD, LSTD and COP, which are considered due to voids consisting of agglomerated vacancy-type point defects, at a high density over the entire radial direction of the crystal, and a region containing these defects becomes V region. Further, along with lowering of the growth rate, the OSF ring is generated from the periphery of the crystal. There exist at a low density outside the OSF ring, L/D (Large Dislocation: an abbreviation for interstitial dislocation loop, such as LSEPD, LFPD and the like) defects (huge dislocation clusters) which are considered due to dislocation loops consisting of agglomerated interstitial silicon atoms, and the region where these defects exist becomes I region (occasionally referred to as L/D region). When the growth rate is further lowered, the OSF ring shrinks to the center of the wafer and disappears, so that the entire plane becomes I region.

N region located between the V region and the I region and outside the OSF ring becomes a region containing no FPD, LSTD and COP to be generated due to voids as well as no LSEPD and LFPD to be generated due to interstitial silicon atoms. In addition, it has been recently found that by further classifying N region, as shown in FIG. 9, there exist Nv region (the region where a lot of vacancies exist) adjacent to the outside of OSF ring and Ni region (the region where a lot of interstitial silicon atoms exist) adjacent to I region, and that when performing thermal oxidation treatment, a lot of oxygen precipitates are generated in Nv region and little oxygen precipitates are generated in Ni region.

Although such an N region conventionally existed only in a part of a plane of wafer, a crystal having N region over the entire radial plane (the entire surface of wafer) has been able to be manufactured by controlling V/G that is a ratio of a pulling rate (V) to an axial temperature gradient (G) at a solid-liquid interface.

Also, in the manufacture of an SOI wafer, as described above, there has been proposed a method in which a silicon single crystal wafer having N region over the entire surface is used as a bond wafer.

For example, there has been proposed an SOI wafer wherein a silicon single crystal is pulled by controlling a ratio of the pulling rate V to the axial temperature gradient G at a solid-liquid interface of the crystal (V/G) within a predetermined range when it is pulled by Czochralski method (CZ method), and the silicon wafer in N region is used as a bond wafer (for example, see Japanese Patent Laid-open (Kokai) No. 2001-146498 (on pages 5–8) and Japanese Patent Laid-open (Kokai) No. 2001-44398 (on pages 2–4, in FIG. 1)).

However, when performing oxidation treatment for bonding the bond wafer and the base wafer together and oxidation treatment for adjusting the thickness of an SOI layer, and subsequently cleaning with hydrofluoric acid to remove an oxide film, even if the silicon single crystal grown in N region is used as the bond wafer, there has been the case that a failure such that the SOI layer was almost entirely or partially destroyed could occurred. Especially, the failure as described above often occurs when a thinner SOI layer is formed. Also, in case that making an SOI layer thinner is further required in future, it is apprehended that the SOI layer may be remarkably degraded even if the silicon wafer grown simply in N region as above is used as a bond wafer and in addition, it is also expected that the quality of the insulator oxide film between the SOI layer and the base wafer may be deteriorated.

DISCLOSURE OF THE INVENTION

The present invention was accomplished in view of the aforementioned circumstances, and its object is to provide an SOI wafer that has an excellent electric property without generation of micro pits by cleaning with hydrofluoric acid etc. even in the case of forming an extremely thin SOI layer with, for example, a thickness of 200 nm or less, and can be produced without increasing the number of process.

In order to achieve the aforementioned object, according to the present invention, there is provided an SOI wafer in which at least a silicon active layer is formed on a support substrate, wherein at least the silicon active layer consists of silicon single crystal grown by Czochralski method, which is occupied by N region outside OSF generated in a shape of a ring and has no defect region detected by Cu deposition method.

As described above, in the case of the SOI wafer of which the silicon active layer consists of silicon single crystal being in N region and having no defect region detected by Cu deposition method, there does not exist even an extremely fine defect in the silicon active layer. And therefore, no micro pits are generated even when it is cleaned with hydrofluoric acid etc. and it becomes the SOI wafer having an excellent electric property. Further, since such an SOI wafer can be produced without increasing process as in the case of using an epi-wafer, production cost can be lowered.

In this case, a thickness of the silicon active layer can be 200 nm or less.

Recently, although the SOI layer is required to be thinner, since there does not exist even an extremely fine defect to be detected by Cu deposition method in the silicon active layer of the SOI wafer according to the present invention, even if a thickness of the silicon active layer is 200 nm or less, it is prevented that the silicon active layer is destroyed due to enlargement of defects by cleaning with hydrofluoric acid and the like, so that there can be obtained an SOI wafer with high quality.

Also, it is preferable that the silicon active layer is formed by being bonded to the support substrate via an oxide film, and in this case it is preferable that a thickness of the oxide film is in the range from 2 nm to 3000 nm.

If it is the SOI wafer, of which the silicon active layer is formed by being bonded to the support substrate via an oxide film as described above, it can be easily produced by a general bonding method. Further, the oxide film having a thickness in the above-mentioned range can be easily formed by heat treatment etc. and in addition, the silicon active layer is surely bonded and insulated via the oxide film so that the SOI wafer with high quality can be obtained.

Also, the SOI wafer can be produced by ion implantation delamination method.

As described above, if the SOI wafer is produced by ion implantation delamination method, the silicon active layer can be made to be extremely thin and to have a uniform thickness and in addition, the SOI wafer with extremely high quality having no defect can be obtained.

Moreover, in the present invention, there is also provided a method for producing an SOI wafer as follows. Namely, there is provided a method for producing an SOI wafer comprising steps of, in a bond wafer that is to be a silicon active layer and a base wafer that is to be a support substrate, implanting hydrogen ions, rare gas ions or mixture gas ions of these gases from a surface of the bond wafer to form an ion-implanted layer inside the bond wafer, bonding the surface of the ion-implanted side of the bond wafer and a surface of the base wafer via an oxide film or directly, and subsequently delaminating a part of the bond wafer at the ion-implanted layer by heat treatment to form an SOI wafer, wherein a silicon wafer consisting of silicon single crystal grown by Czochralski method, which is occupied by N region outside OSF generated in a shape of a ring and has no defect region detected by Cu deposition method, is used as the bond wafer.

If an SOI wafer is produced by such a method, the silicon active layer reflects the characteristic of the bond wafer, i.e., it is occupied by N region and does not have even a defect region to be detected by Cu deposition method, and therefore, the SOI wafer with extremely high quality can be obtained. Further, since the number of processes does not increase, production cost can be lowered.

As explained above, according to the present invention, there is provided an SOI wafer having an excellent electric property wherein the silicon active layer is in a neutral (N) region without containing V region, OSF region and huge dislocation cluster (LSEP, LFPD) region, further does not contain Cu deposition defect region either, and no micro pits are generated on the surface during manufacturing process of the SOI wafer.

If a device is fabricated by using such an SOI wafer, a device having an excellent electric property can be fabricated with high yield.

BEST MODE FOR CARRYING OUT THE INVENTION

Hereinafter, the present invention will be explained in more detail.

The inventors of the present invention performed the following investigations and studies before accomplishment of the present invention.

Figure 2:
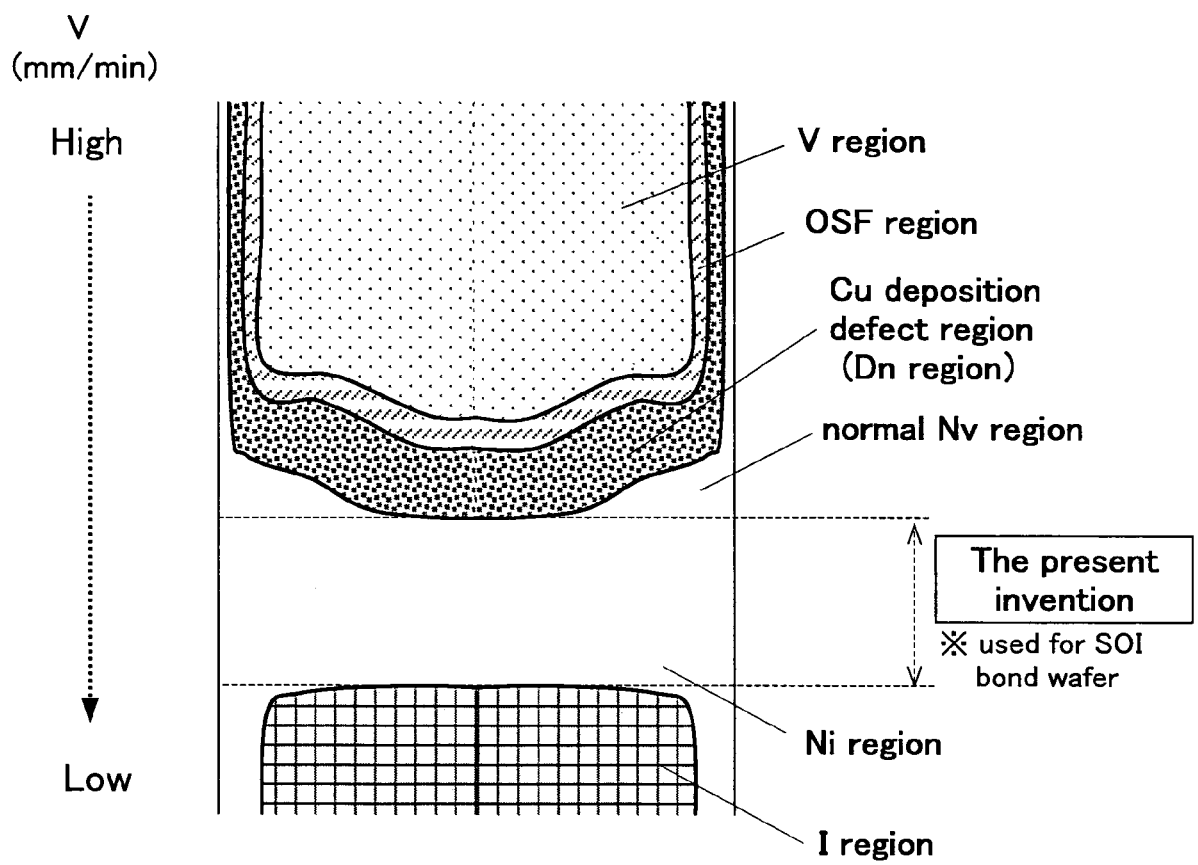
FIG. 2 shows an explanatory view showing a region of a crystal used for manufacturing an SOI wafer according to the present invention.

First, it has been known that, in the case of gradually lowering a growth rate from high speed to low speed from a shoulder to an tail of straight body of a crystal when pulling the silicon single crystal, OSF shrinks at a certain growth rate, and after that, phases of, in order, Nv region, Ni region and I (huge dislocation clusters generating) region are formed in lower speed regions. Recently, it has been also found that there partially exists in Nv region, a region where defects can be detected by Cu deposition method immediately after disappearance of OSF, as shown in FIG. 2 (for example, see Japanese Patent Laid-open (Kokai) 2002-201093).

Cu deposition method is a method for evaluating a wafer by which positions of defects in a semiconductor wafer can be accurately measured, detection limit for defects in the semiconductor wafer can be improved, and finer defects can be accurately measured and analyzed.

The specific evaluation method of a wafer comprises forming an insulator film with a predetermined thickness on a surface of the wafer, destroying the insulator film on the defect part formed near the surface of the wafer, and depositing electrolyte such as Cu at the defect part. Namely, Cu deposition method is an evaluation method utilizing the fact that when electric potential is applied to an oxide film formed on the surface of the wafer in the liquid where Cu ions are dissolved, electric current flows to the part where the oxide film is degraded, and Cu ions are precipitated as Cu. It is known that defects such as COPs exist in the part where an oxide film is apt to be degraded.

The defect part of the wafer where Cu is deposited can be analyzed by observation with the naked eye under a collimated light or directly, to evaluate a distribution and density thereof. Furthermore, it can also be confirmed by microscope observation, a transmission electron microscope (TEM), a scanning electron microscope (SEM), or the like.

Figure 9:
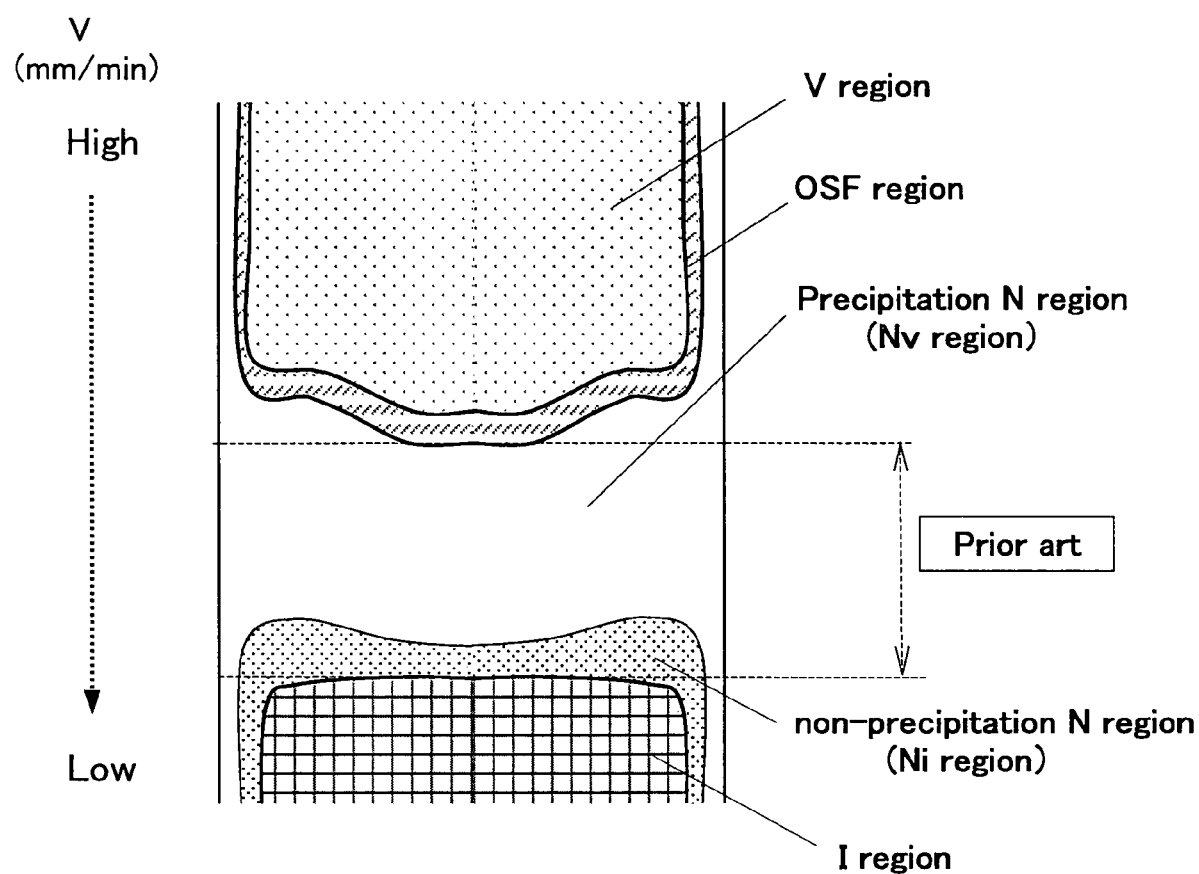
FIG. 9 is an explanatory view showing a region of a crystal conventionally used as a bond wafer.

And those skilled in the art could easily conceive the use of a silicon single crystal grown in the range from Nv region after OSF shrinks to a position where Ni region disappears (to a position where I region occurs) as a bond wafer (see FIG. 9).

However, as to an extremely thin SOI layer having a thickness of, for example, 200 nm or less, it is preferable that even a micro pit defect does not remain therein. Then, the inventors of the present invention investigated defects in these regions. Specifically, when a growth rate of a silicon single crystal is gradually lowered from high speed to low speed, the V region just before disappearance of OSF was subjected to FIB (focused ion beam) processing after identification of a coordinate by a surface inspection apparatus (MAGICS). When the points were observed by TEM, the existence of micro pit defects with about 20 nm could be confirmed.

Further investigations and studies as to the other regions were performed, and the followings were found.

Voids become finer as V region is a region just before disappearance of OSF, however, micro pit defects in V region remarkably deteriorate an time zero dielectric breakdown (TZDB) characteristic even if they are considerably fine.

On the other hand, when gradually lowering a growth rate of a silicon single crystal from high speed to low speed, as to Cu deposition defect region immediately after disappearance of OSF, there is no marked deterioration of breakdown voltage level as in V region, and although the TZDB characteristic indicates C mode in a region of almost 100% in plane, a little deterioration in time dependent dielectric breakdown (TDDB) characteristic can be seen.

Further, it was found that existence of micro pit defects on a surface of an SOI layer causes breaking of the SOI layer by enlargement of the defect size because of etching when cleaning with hydrofluoric acid performed after oxidation for bonding the bond wafer and the base wafer and oxidation treatment for adjusting a thickness of the SOI layer. In particular, in the case that an SOI layer is thinned to have a thickness of less than 100 nm for the purpose of expanding a depletion layer, even if the defects are fine enough to have a size of below 20 nm, which can be detected by Cu deposition method, when these defects exist, the defect size may be enlarged by etching to thereby destroy the SOI layer when cleaning with hydrofluoric acid. As a result, these fine defects cause electrical fault and remarkable derogation of reliability.

Namely, it was found that the oxide dielectric breakdown voltage in the aforementioned regions, especially N region, is not inherently so low, however, when the silicon single crystal are used as an active layer of an SOI wafer, even if the size of defects is fine enough in comparison with a thickness of the SOI layer, there is a possibility of derogation of electrical reliability.

As a result of the aforementioned investigations and studies as above, the inventors of the present invention found that if the silicon active layer is occupied by N region and does not have even a defect region detected by Cu deposition method, there can be obtained an SOI wafer which has an excellent electrical property, wherein it excels in TZDB characteristic and TDDB characteristic, and in addition which dose not cause enlargement of the defect size and destruction by etching even when it is subjected to cleaning with hydrofluoric acid. And the inventors of the present invention found that, in order to manufacture such an SOI wafer, an SOI layer may be formed using as a bond wafer, for example, a silicon wafer which consists of silicon single crystal grown by CZ method, occupied by N region and having no defect region detected by Cu deposition method. Thus, they accomplished the present invention.

Hereinafter, embodiments of the present invention will be explained in detail by referring to the appended drawings, but the present invention is not limited thereto.

Figure 1:
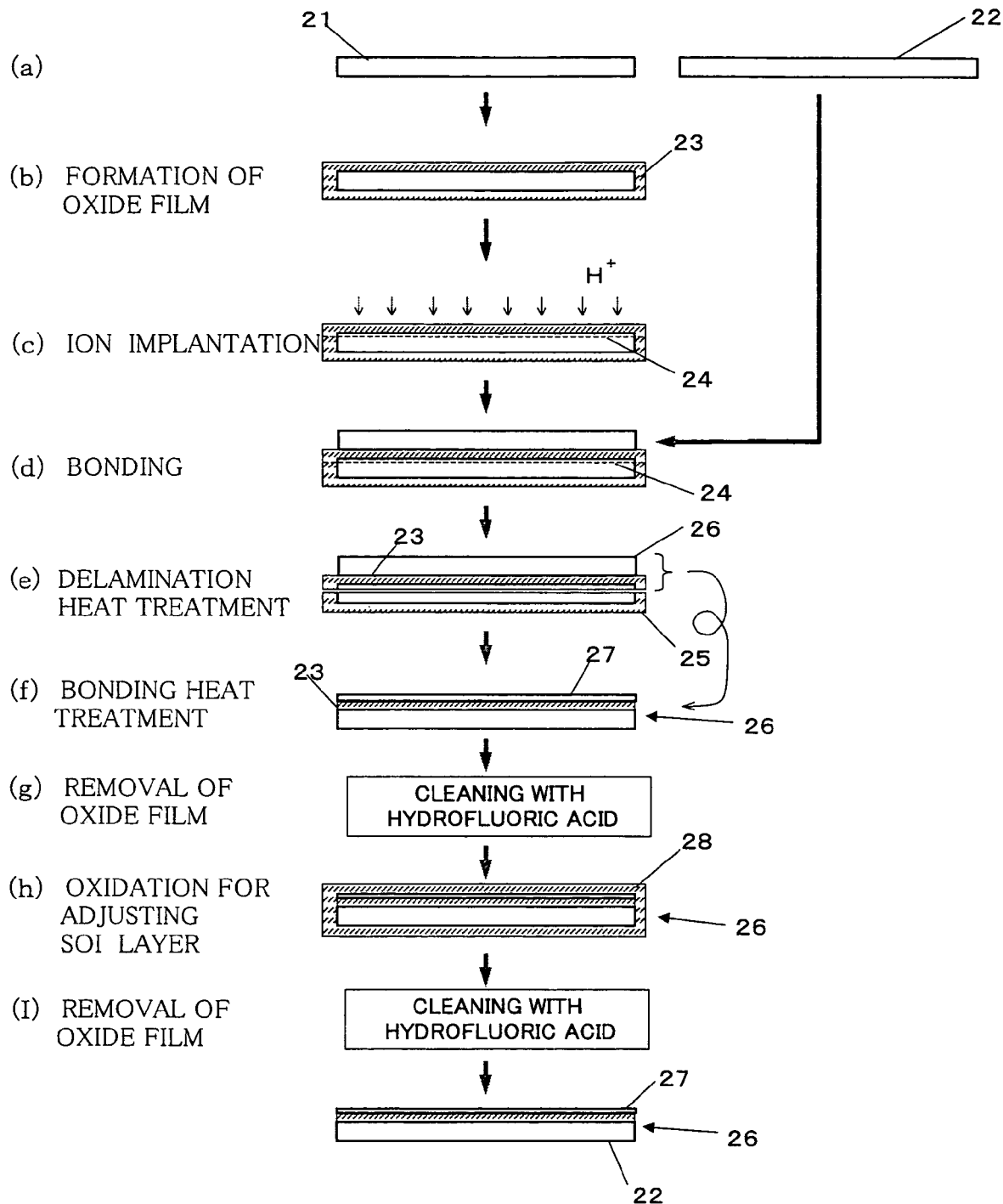
FIG. 1 is a flowchart showing an example of a manufacturing process of an SOI wafer according to the present invention.

FIG. 1 is a flowchart showing an example of a manufacturing process of an SOI wafer according to the present invention by ion implantation delamination method.

First, in the first process (a), two mirror-polished silicon wafers, i.e., a bond wafer 21 that is to be SOI layer and a base wafer 22 that is to be a substrate, are prepared. Here in the present invention, a silicon wafer consisting of a silicon single crystal grown by Czochralski method (CZ method), which is occupied by N region outside OSF generated in a ring shape and has no defect region detected by Cu deposition method (in the present invention, occasionally referred to as "Cu deposition defect region"), is used as the bond wafer 21.

Figure 3:
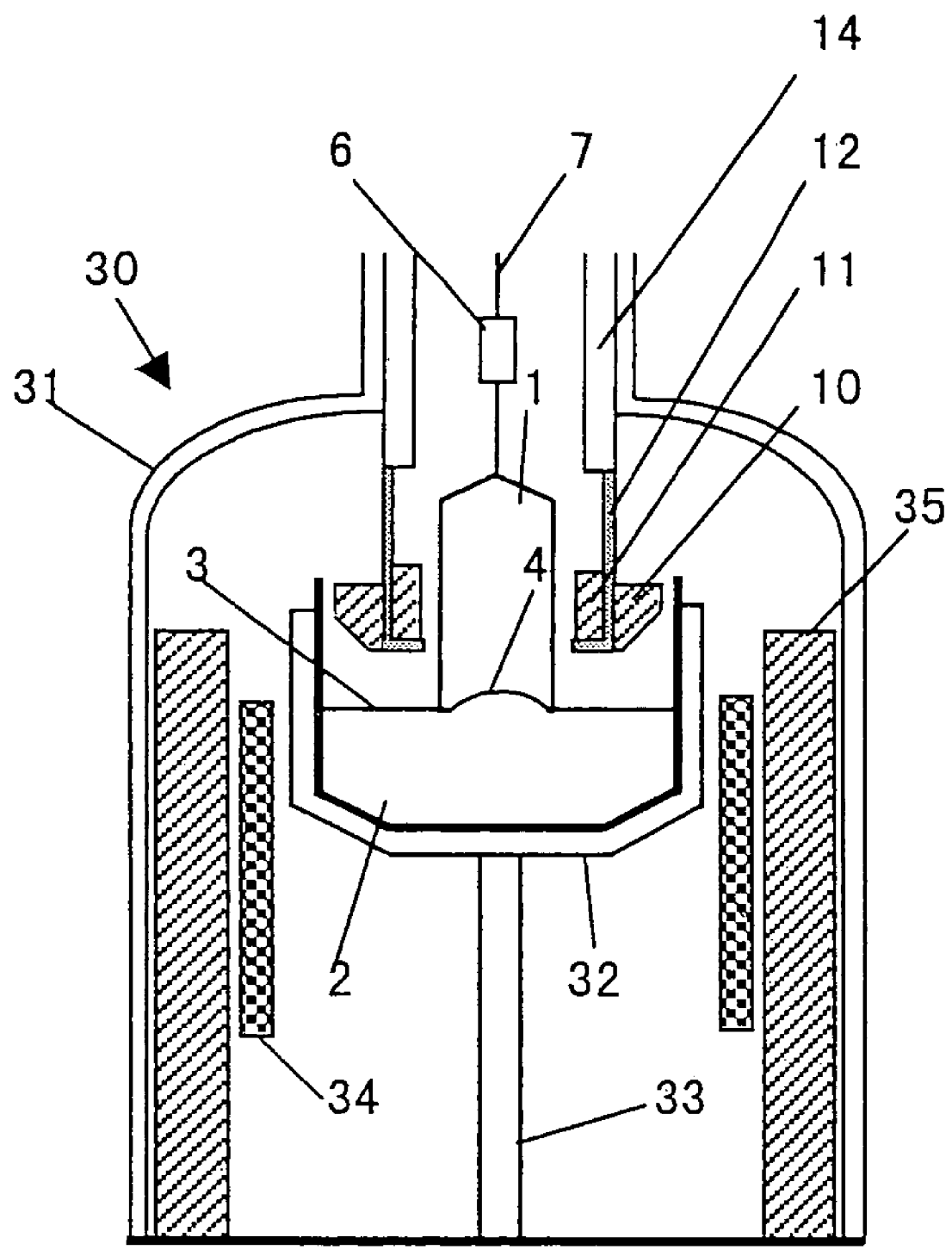
FIG. 3 shows an example of an apparatus for producing a CZ silicon single crystal that can be used in the present invention.

The aforementioned silicon single crystal which has N region and no Cu deposition defect region can be grown while controlling V/G by using, for example, an apparatus for producing a single crystal as shown in FIG. 3. The apparatus 30 for pulling a single crystal has a pulling chamber 31, a crucible 32 installed in the pulling chamber 31, a heater 34 disposed around the crucible 32, a crucible holding shaft 33 and a rotation mechanism (not shown) thereof for rotating the crucible 32, a seed chuck 6 for holding a silicon seed crystal, a wire 7 for pulling the seed chuck 6, and a winding mechanism (not shown) for rotating or winding up the wire 7. A heat insulation material 35 is disposed around heater 34.

The crucible 32 is composed of an inner quartz crucible for accommodating a silicon melt (melt) 2 and an outer graphite crucible located outside the quartz crucible.

Recently, it is also often the case that a method, so-called MCZ method, is used in which magnets not shown are disposed horizontally outside the pulling chamber 31 and a magnetic field in the horizontal direction, the vertical direction, or the like is applied to the silicon melt 2 to inhabit convection of the melt and achieve stable growth of a single crystal.

A cylindrical graphite cylinder (heat shielding plate) 12 is provided as surrounding a grown silicon single crystal 1, and further in the vicinity of a solid-liquid interface 4 of the crystal, an annular outer heat insulation material 10 and an inner heat insulation material 11 are provided outside and inside the cylinder, respectively. These heat insulation materials 10 and 11 are disposed so that a gap of 2–20 cm is formed between each lower end and a surface 3 of the silicon melt 2. Thereby, difference between temperature gradient Gc [° C./cm] at the center part of the crystal and temperature gradient Ge in the periphery of the crystal becomes small, and it is also possible to control temperature inside a furnace so that, for example, the temperature gradient in the periphery of the crystal is lower than that at the center of the crystal.

A cooling cylinder 14 is placed on the graphite cylinder 12 to perform forced cooling by flowing refrigerant inside. Furthermore, it is also possible to provide a cylindrical cooling device that cools a single crystal by blowing cooling gas or shielding radiant heat.

In order to produce a silicon single crystal using the apparatus 30 for pulling a single crystal, first, a highly pure polycrystalline material of silicon is heated to the melting point (approximately 1420° C.) or higher to be melted in the crucible 32. Then, the tip end of the seed crystal is brought into contact with or immersed in the approximately central portion of the surface of the melt 2 by unwinding the wire 7. Subsequently, while the crucible holding shaft 33 is rotated, the wire 7 is wound up with being rotated. Thereby, the seed crystal is also pulled with rotating, and growth of a silicon single crystal is initiated. Then, an approximately cylindrical single crystal ingot 1 can be obtained by adequate control of a pulling rate and temperature.

In order to grow a silicon single crystal having N region and no Cu deposition defect region, for example, a crystal is grown with controlling a growth rate between the growth rate at the boundary where the defect region detected by Cu deposition method remaining after disappearance of OSF ring is disappeared when gradually decreasing a growth rate of silicon single crystal during pulling and the growth rate at the boundary where interstitial dislocation loop is generated when gradually decreasing a growth rate of silicon single crystal further. Namely, when a growth rate of a silicon single crystal being pulling is gradually lowered from high speed to low speed from the shoulder of the crystal through the tail of straight body thereof, as shown in FIG. 2, each phase of, in order, V region, OSF ring region, Cu deposition defect region, Nv region, Ni region and I region (huge dislocation cluster generating region) is formed depending on its growth rate. And, the single crystal is grown by controlling a growth rate between the growth rate at the boundary where a defect region detected by Cu deposition method remaining after disappearance of OSF ring disappears in N region and the growth rate at which I region is generated when the growth rate is gradually lowered further. By this manner, a silicon single crystal of N region containing neither of V region defects such as FPD, I region defects such as huge dislocation clusters (LSEPD, LFPD), OSF defects, nor defects detected by Cu deposition method can be grown.

After the silicon single crystal grown as described above is fabricated into mirror-polished wafer (PW), the PW is picked out at random from a unit lot for each ingot block and then evaluation by Cu deposition is performed. Thus, in the case of free of defects, the wafer can be applied as a bond wafer.

Next, in the process (b) of FIG. 1, a surface of at least either of the bond wafer 21 or the base wafer 22 is oxidized. The bond wafer 21 can be thermally oxidized herein to form an oxide film 23, for example, having a thickness of 2 nm–3000 nm on its surface. If a thickness of the oxide film 23 is less than 2 nm, there is a possibility that an insulation property cannot be retained. On the other hand, if the oxide film 23 having a thickness over 3000 nm is formed, there may occur a problem of decrease of productivity such that heat treatment time becomes extremely long or the like. Therefore, it is preferable that the thickness is within the range described above.

In the process (c), hydrogen ions are implanted from one surface of the bond wafer 21 on the surface of which the oxide film 23 is formed. Rare gas ions or mixture gas ions of hydrogen ions and rare gas ions may also be implanted. Thereby, an ion-implanted layer parallel to the surface of the wafer at an average penetration depth of ions can be formed inside the wafer. The depth of the ion-implanted layer is reflected in a thickness of an SOI layer to be formed finally. Accordingly, by implanting ions with controlling implantation energy etc., it is also possible to make an SOI layer having a thickness of for example 200 nm or less.

In the process (d), the surface of the ion-implanted side of the bond wafer 21 and a surface of the base wafer 22 are bonded together via the oxide film 23. For example, by contacting surfaces of two wafers 21 and 22 with each other under a clean atmosphere at room temperature, both wafers are bonded without an adhesive agent, or the like.

Next, in the process (e), a part of the bond wafer 21 is delaminated at the ion-implanted layer 24 by heat treatment. For example, if the wafers in which the bond wafer 21 and the base wafer 22 are bonded together are subjected to a heat treatment under an inert gas atmosphere at a temperature of about 500° C. or more, the wafers are separated into a delaminated wafer 25 and an SOI wafer 26 (an SOI layer 27+a buried oxide film 23+the base wafer 22) due to rearrangement of the crystal and aggregation of bubbles.

In the process (f), the SOI wafer 26 is subjected to a bonding heat treatment. In this process (f), since bonding strength between the wafers brought into close contact in the aforementioned bonding step (d) and the delamination heat treatment step (e) is too weak to be used as it is in a device fabrication process, the SOI wafer 26 is subjected to a heat treatment at high temperature as a bonding heat treatment to be sufficient bonding strength. For example, this heat treatment can be performed in a range from 30 minutes to 2 hours at 1050° C.–1200° C. under an inert gas atmosphere.

In the process (g), an oxide film formed on the surface of the SOI wafer 26 is removed by cleaning with hydrofluoric acid. At this time, in the case of using as a bond wafer a silicon wafer grown simply in N region according to a conventional way, micro pits may be generated. However, since the SOI wafer 26 according to the present invention is that the SOI layer 27 is occupied by N region and has no Cu deposition defect region, neither the pits enlarge by cleaning with hydrofluoric acid, nor the SOI layer 27 is destroyed.

Further, in the process (h), according to need, oxidation for adjusting a thickness of the SOI layer 27 is performed and subsequently in the process (I), an oxide film 28 is removed by cleaning with hydrofluoric acid. Thereby, a thickness of the SOI layer can be adjusted to, for example, 200 nm or less.

The SOI wafer manufactured through the processes (a)–(I) as described above has no micro pit on a surface of the SOI wafer and its electrical property becomes extremely excellent.

Hereinafter, the present invention will be explained in reference to an example, however, the present invention is not limited thereto.

EXAMPLES (Experiment 1): Confirmation of Pulling Conditions

By using the apparatus 30 for producing a single crystal shown in FIG. 3, the experiment on gradual lowering of a crystal growth rate was performed as described below and the growth rates at boundaries between respective regions were examined.

First, 150 kg of polycrystalline silicon as a raw material was charged in a quartz crucible having a diameter of 24 inches (600 mm), and a silicon single crystal having a diameter of 210 mm was grown. Oxygen concentration was controlled in the range of 23–26 ppma (ASTM'79 value). When pulling the single crystal, as shown in FIG. 4(A), a growth rate was controlled to be linearly and gradually lowered from a head to a tail of the crystal in the range from 0.70 mm/min to 0.30 mm/min.

Figure 4:
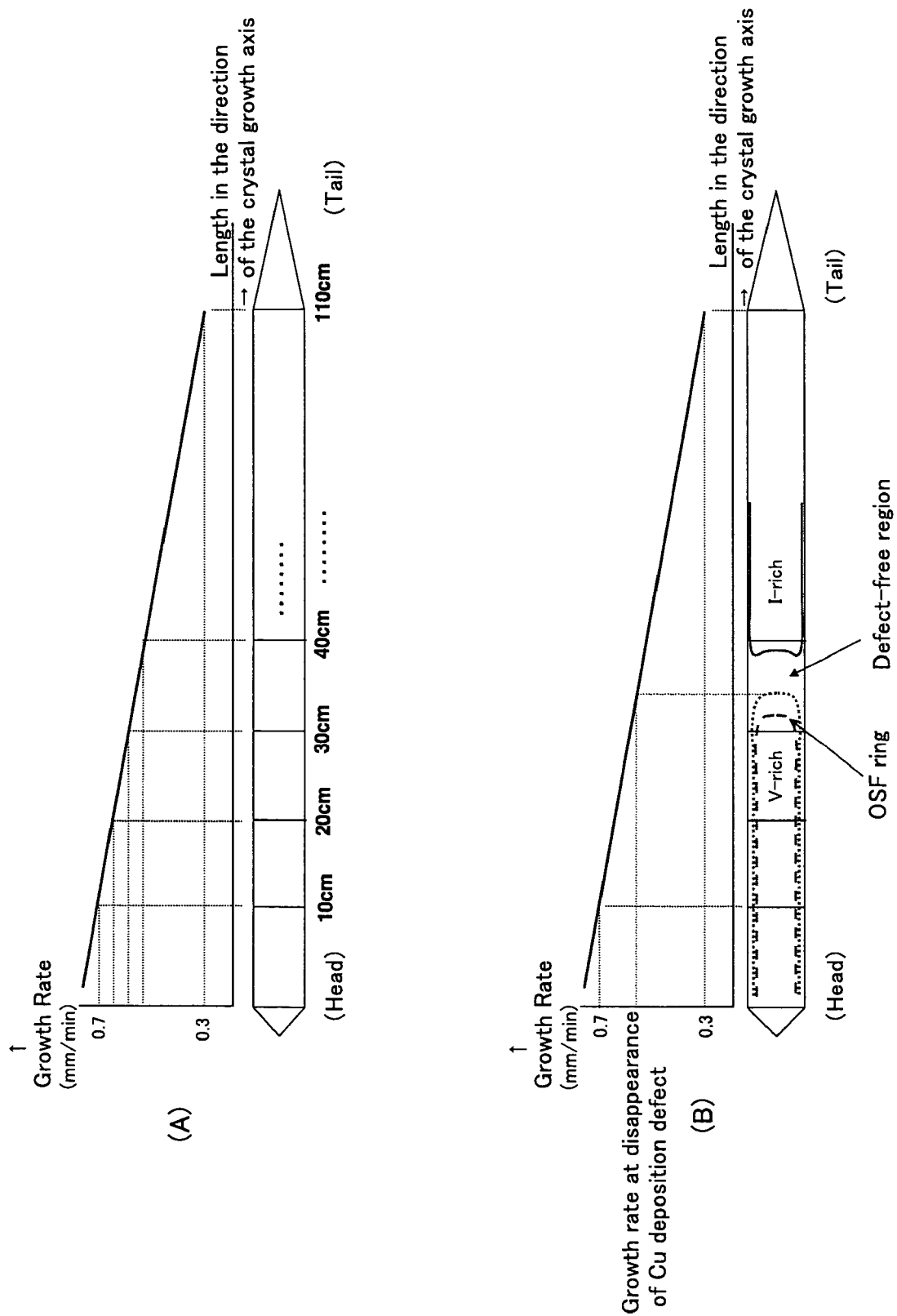
FIG. 4(A) shows the relationship between a growth rate of a single crystal and a cutting position of the crystal.
FIG. 4(B) is an explanatory view showing the relationship between a growth rate and each region.

Then, as shown in FIGS. 4(A) and (B), the pulled single crystal was cut lengthwise in the direction of the crystal growth axis from the head to the tail of the pulled single crystal, and after that, mirror-polished samples in a shape of a wafer having a diameter of 200 mm were produced.

As to one of the samples, a distribution of each region of V region, OSF region and I region, and the growth rates at the boundaries of the regions were confirmed by means of wafer lifetime (WLT) measurement (measuring instrument: SEMILAB WT-85) after heat treatment for oxygen precipitation. Further, another sample was subjected to Cu deposition treatment after forming a thermal oxide film, and a distribution of oxide film defects was confirmed. The detailed evaluation process in this experiment will be given below.

Figure 5:
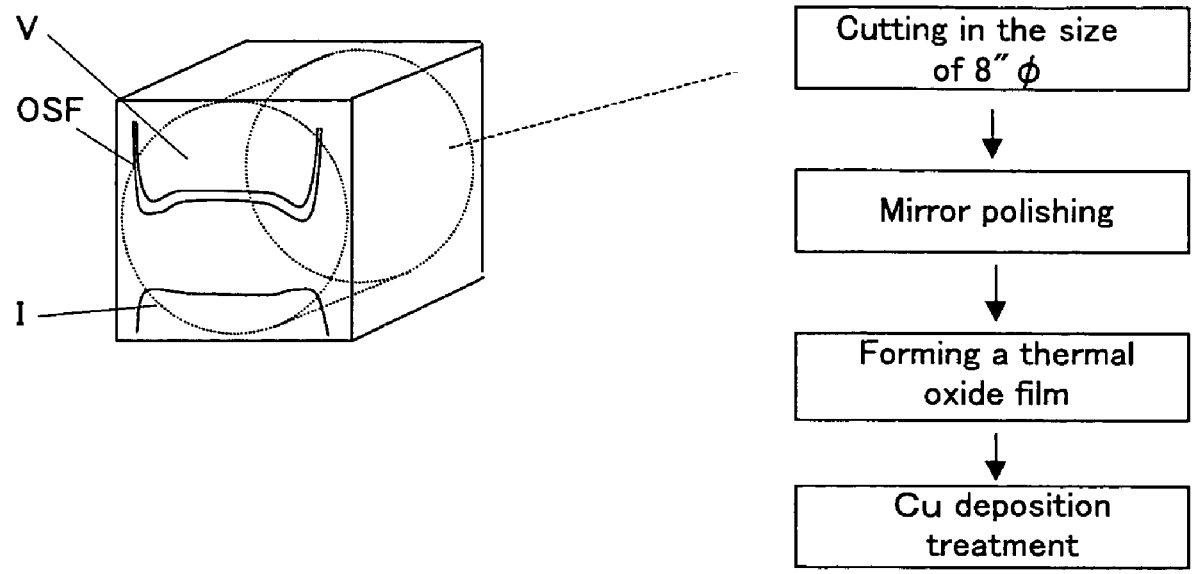
FIG. 5 is an explanatory view showing a method for producing a sample for Cu deposition evaluation.

(a) The ingot having a diameter of 210 mm was cut into blocks by a length of 10 cm in the direction of a crystal growth axis, and each of them was then cut lengthwise in the direction of the crystal growth axis. Thereafter, cylinders with a diameter of 200 mm (8 inches) were cut out in a direction perpendicular to the crystal growth axis as shown in FIG. 5, and mirror-polished samples in a shape of wafer were obtained.

(b) One of the above samples was subjected to heat treatment at 620° C. in a heat treatment furnace for a wafer for 2 hours (nitrogen atmosphere) and to subsequent two-step heat treatment consisting of heat treatment at 800° C. for 4 hours (nitrogen atmosphere) and heat treatment at 1000° C. for 16 hours (dried oxygen atmosphere). Then it was cooled and a WLT map was created by SEMILAB WT-85.

(c) The second sample was subjected to Cu deposition treatment after forming a thermal oxide film on its surface, and a distribution of oxide film defects was confirmed. The evaluation conditions were as follows.

1) Oxide film: 25 nm,
2) field intensity: 6 MV/cm,
3) time of impressed voltage: 5 minutes.

Results

Figure 6:
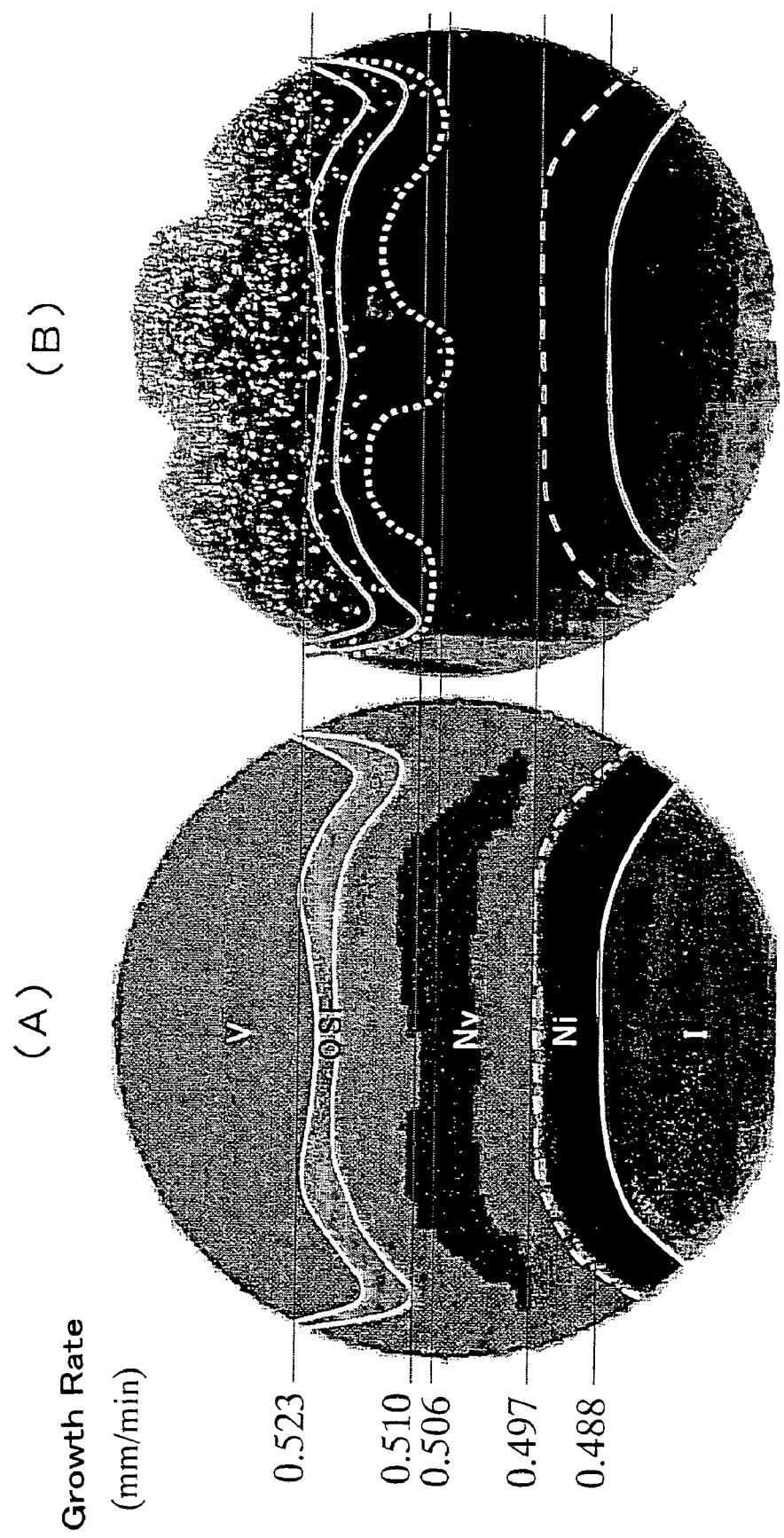
FIG. 6 shows (A) wafer lifetime and (B) Cu deposition defects in a cross-section when cutting a crystal lengthwise.

The results as shown in FIGS. 6(A) and (B) were obtained from the above-mentioned experiment, and growth rates at the boundaries of regions such as V region, OSF region, N region and I region were confirmed.

V region/OSF region boundary: 0.523 mm/min,
OSF disappearing boundary: 0.510 mm/min,
Cu deposition defect disappearing boundary: 0.506 mm/min,
precipitation N region/non-precipitation N region boundary: 0.497 mm/min,
non-precipitation N region/I region boundary: 0.488 mm/min.

(Experiment 2): Manufacture of an SOI Wafer

Figure 7:
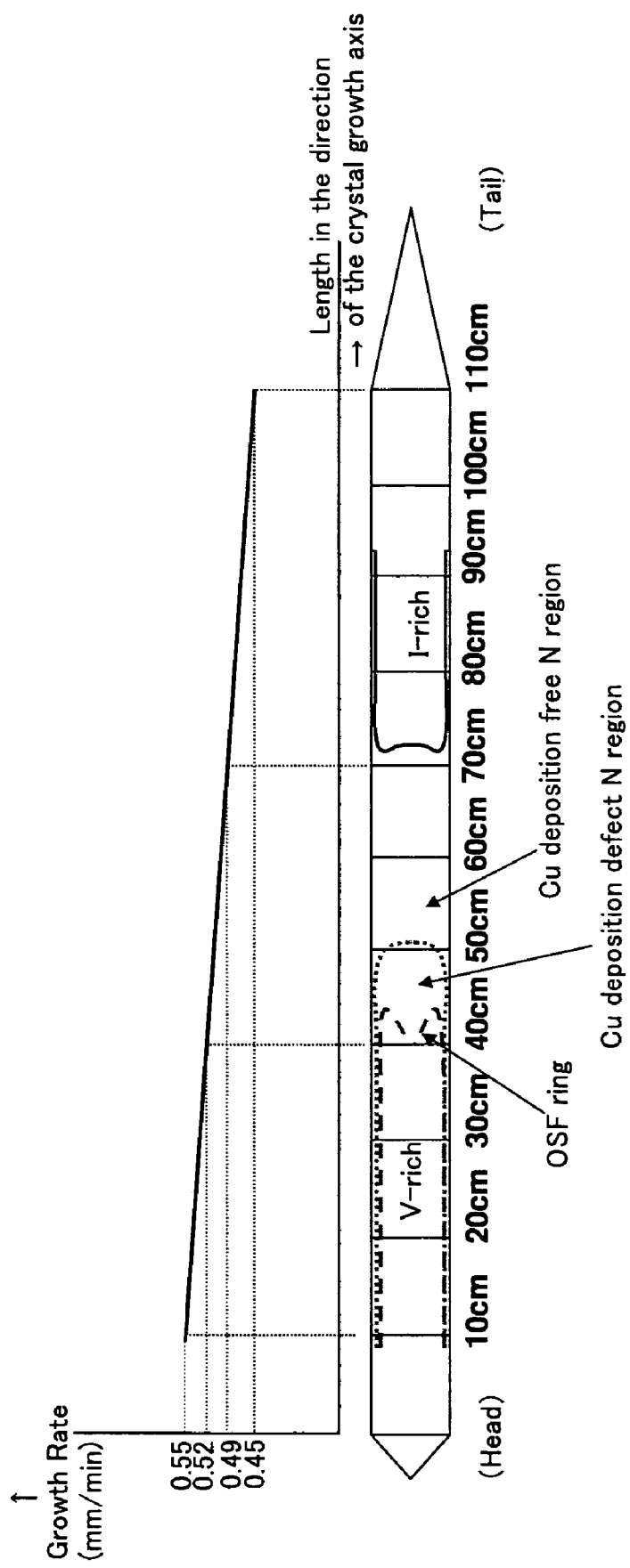
FIG. 7 shows the relationship between a growth rate and a cutting position of a crystal in Experiment 2.

In the same apparatus as Experiment 1 shown in FIG. 3, 150 kg of polycrystalline silicon as a raw material was charged into a 24-inch quartz crucible. In this time, as shown in FIG. 7, a growth rate was lowered more gradually than that in Experiment 1 in the range from 0.55 mm/min to 0.45 mm/min from a head to a tail of an ingot with a diameter of 210 mm, and controlled so that N region including Cu deposition defects and N region without including Cu deposition defects were formed in the region from 40 cm to 70 cm of a straight body of a crystal. Also, the crystal was produced so that the oxygen concentration was 24–26 ppma (ASTM'79). Then, the quality evaluation and SOI processing were performed according to the following procedure.

(1) After pulling the crystal, wafers were cut out in order from the head side of each crystal block in the direction of the crystal growth axis. The numbers were printed on the wafers by laser marking so as to identify the order of cutting, and the wafers were mirror-polished.

(2) The first PW from the head side of each unit block was divided into ¼ size, and FPD, LFPD, LSEP and OSF were investigated. Subsequently, as to the second PW from the head side of each unit block, a distribution of Cu deposition defects was observed. 5 PWs in total that were the third PW through the seventh PW from the head side of each unit block were put into a process for manufacturing SOI wafers (SOI process). Again, as to the eighth PW from the head side, FPD, LFPD, LSEP and OSF were evaluated, as to the ninth PW, a distribution of Cu deposition defects was observed, and 5 PWs in total that were the tenth PW through the fourteenth PW were put into the SOI process. In this manner, among a unit of 7 PWs in the direction of the crystal growth axis, 2 PWs from the head side were evaluated in quality, and remaining 5 PWs were processed into SOI wafers.

(3) As a result of the evaluation described above, the region up to half of a block cut from the position from about 40 cm to 50 cm of a straight body of the crystal was V region and OSF region, the region up to approximately 50 cm of the straight body of the crystal was N region where Cu deposition defects was generated, the region from about 50 cm to 70 cm of the straight body of the crystal was N region without Cu deposition defects, and the region from about 70 cm of the straight body of the crystal to a tail thereof was I region.

(4) By using mirror surface wafers of the lot consisting of 5 wafers in above (1) as bond wafers, each of them was bonded with a base wafer according to the ion implantation delamination method based on the processes shown in FIG. 1. After that, SOI wafers having an SOI layer with a thickness of 50 nm were produced.

Figure 8:
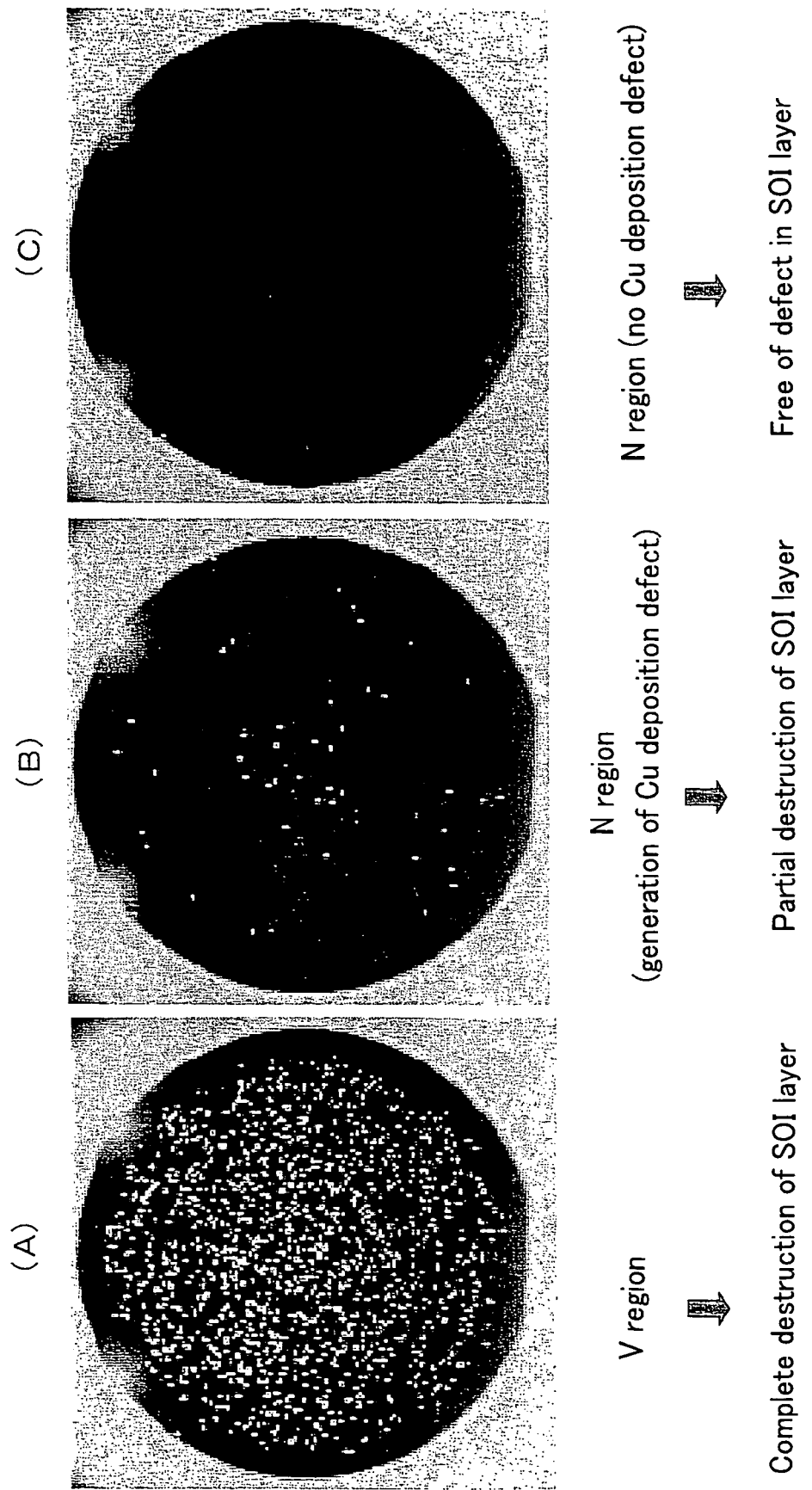
FIG. 8 shows a defect distribution of each region of a crystal by Cu deposition method:
(A) V region,
(B) N region (generation of Cu deposition defects),
(C) N region (no Cu deposition defect).

When the surfaces of the SOI layer of these SOI wafers were measured with a particle counter (Surfscan SP-1, product of KLA-Tencor Cooperation), it was found that SOI layers wherein silicon wafers having V region or OSF region were used as bond wafers were almost completely destroyed (FIG. 8(A)).

Also, as to the bond wafer in N region where Cu deposition defects was generated, the SOI layer was partially destroyed in low density (FIG. 8(B)).

However, in the case of using the bond wafer in N region without Cu deposition defects, no defect could be observed on the SOI layer (FIG. 8(C)). Further, no etch pit defect could be found on the SOI layer in N region without Cu deposition defect even in the case of performing measurement of defect density after leaving the SOI wafers in hydrofluoric acid solution of 50% for 30 minutes without stirring.

The present invention is not limited to the embodiment described above. The above-described embodiment is mere an example, and those having substantially the same structure as technical ideas described in the appended claims and providing the similar functions and advantages are included in the scope of the present invention.

For example, in the embodiment, the case of producing an SOI wafer by using two silicon wafers by ion implantation delamination method was explained, but the present invention is not limited to this production method. For example, the present invention can also be applied to the case of producing an SOI wafer by directly bonding a silicon wafer as a bond wafer, which consists of silicon single crystal grown by Czochralski method, occupied by N region outside OSF generated in a ring shape, and having no defect region detected by Cu deposition method, to an insulator support substrate such as quartz, SiC and sapphire without an oxide film.

Furthermore, in also the case of using SIMOX method, namely, a method for producing an SOI wafer by heat treatment after implanting oxygen ions into a silicon wafer, an SOI wafer according to the present invention can be produced by using a silicon wafer consisting of silicon single crystal grown by Czochralski method, which is occupied by N region outside OSF generated in a ring shape and has no defect region detected by Cu deposition method.

The invention claimed is:

1. An SOI wafer comprising:
   a support substrate chosen from insulator support substrates and support substrates having insulator layers; and
   at least a silicon active layer formed on the support substrate;
   wherein the silicon active layer of the SOI wafer is formed by bonding to the support substrate, either via an insulator layer or directly to the support substrate for insulator support substrates, a bond wafer that consists of silicon single crystal grown by Czochralski method, that is occupied by a neutral region outside oxidation-induced stacking faults generated in a shape of a ring and that has no defect region detected by Cu deposition method.

2. The SOI wafer according to claim 1, wherein a thickness of the silicon active layer is 200 nm or less.

3. The SOI wafer according to claim 2, wherein the SOI wafer is produced by ion implantation delamination method.

4. The SOI wafer according to claim 2, wherein the silicon active layer is formed by being bonded to the support substrate via an oxide film.

5. The SOI wafer according to claim 4, wherein the SOI wafer is produced by ion implantation delamination method.

6. The SOI wafer according to claim 4, wherein a thickness of the oxide film is in the range from 2 nm to 3000 nm.

7. The SOI wafer according to claim 6, wherein the SOI wafer is produced by ion implantation delamination method.

8. The SOI wafer according to claim 1, wherein the silicon active layer is formed by being bonded to the support substrate via an oxide film.

9. The SOI wafer according to claim 8, wherein the SOI wafer is produced by ion implantation delamination method.

10. The SOI wafer according to claim 8, wherein a thickness of the oxide film is in the range from 2 nm to 3000 nm.

11. The SOI wafer according to claim 10, wherein the SOI wafer is produced by ion implantation delamination method.

12. The SOI wafer according to claim 1, wherein the SOI wafer is produced by ion implantation delamination method.

13. A method for producing an SOI wafer comprising:
   implanting hydrogen ions, rare gas ions or mixture gas ions of these gases from a surface of a bond wafer to form an ion-implanted layer inside the bond wafer,
   bonding the surface of the ion-implanted side of the bond wafer and a surface of a base wafer support substrate, said bonding being either via an oxide film or directly, and
   delaminating a part of the bond wafer at the ion-implanted layer by heat treatment to form an SOI wafer having a silicon active layer, wherein the silicon active layer is formed from the bond wafer that consists of a silicon wafer consisting of silicon single crystal grown by Czochralski method, that is occupied by a neutral region outside oxidation-induced stacking faults generated in a shape of a ring and that has no defect region detected by Cu deposition method.

* * * * *